(12) United States Patent
Song

(10) Patent No.: US 11,186,907 B2
(45) Date of Patent: Nov. 30, 2021

(54) DEPOSITION APPARATUS FOR BOTH LATERAL PORTIONS OF SUBSTRATE

(71) Applicant: TETOS Co., Ltd., Asan-si (KR)

(72) Inventor: Kun Ho Song, Asan-si (KR)

(73) Assignee: TETOS Co., Ltd., Asan-si (KR)

( * ) Notice: Subject to any disclaimer, the term of this patent is extended or adjusted under 35 U.S.C. 154(b) by 0 days.

(21) Appl. No.: 16/872,389

(22) Filed: May 12, 2020

(65) Prior Publication Data

US 2021/0079516 A1 Mar. 18, 2021

(30) Foreign Application Priority Data

Sep. 16, 2019 (KR) ........................ 10-2019-0113248

(51) Int. Cl.
| | |
|---|---|
| *H01J 37/34* | (2006.01) |
| *C23C 14/50* | (2006.01) |
| *H01L 27/12* | (2006.01) |
| *C23C 14/54* | (2006.01) |
| *C23C 14/34* | (2006.01) |
| *H01J 37/32* | (2006.01) |

(52) U.S. Cl.
CPC .......... *C23C 14/50* (2013.01); *C23C 14/3464* (2013.01); *C23C 14/541* (2013.01); *H01J 37/32724* (2013.01); *H01J 37/3417* (2013.01); *H01L 27/124* (2013.01); *H01J 2237/002* (2013.01); *H01J 2237/20214* (2013.01); *H01J 2237/332* (2013.01)

(58) Field of Classification Search
CPC ... C23C 14/3464; C23C 14/50; C23C 14/505; C23C 14/541; C23C 14/56; H01J 37/32724; H01J 37/3417; H01J 2237/002; H01J 2237/20214; H01J 2237/332; H01L 27/124
USPC ............ 204/298.09, 298.24, 298.25, 298.26, 204/298.28
See application file for complete search history.

(56) References Cited

U.S. PATENT DOCUMENTS

| | | | | |
|---|---|---|---|---|
| 6,964,731 | B1 * | 11/2005 | Krisko .................. | C03C 17/245 204/192.12 |
| 8,535,496 | B2 * | 9/2013 | Wang ..................... | C23C 14/505 204/298.27 |
| 10,964,509 | B2 * | 3/2021 | Song ....................... | C23C 14/04 |

* cited by examiner

*Primary Examiner* — Rodney G McDonald
(74) *Attorney, Agent, or Firm* — Revolution IP, PLLC

(57) ABSTRACT

Disclosed is a deposition apparatus for a substrate, in particular, a deposition apparatus for both lateral portions of a substrate, in which at least one substrate is inserted in and mounted to a revolvably disposed substrate mounting drum in a direction from an outside circumferential surface toward an inside circumferential surface, one lateral portion of the substrate exposed protruding from an inside circumferential surface is subjected to deposition based on an inside source target, and the other lateral portion of the substrate exposed protruding from an outside circumferential surface is subjected to deposition based on an outside source target, thereby depositing wiring to both lateral portions of the substrate at once, and achieving a three-dimensional (3D) deposition improved in uniformity and quality.

3 Claims, 7 Drawing Sheets

DEPOSITION APPARATUS FOR BOTH LATERAL PORTIONS OF SUBSTRATE

CROSS-REFERENCE TO RELATED THE APPLICATION

This application is based on and claims priority under 35 U.S.C. § 119 to Korean Patent Application No. 10-2019-0113248 filed on Sep. 16, 2019 in the Korean Intellectual Property Office, the disclosure of which is incorporated by reference herein in its entirety.

BACKGROUND OF THE INVENTION

(a) Field of the Invention

The disclosure relates to a deposition apparatus for a substrate, and more particularly to a deposition apparatus for both lateral portions of a substrate, which can deposit wiring to both lateral portions of the substrate at once, and achieve a three-dimensional (3D) deposition improved in uniformity and quality.

(b) Description of the Related Art

Technology for forming a bezel-less substrate has recently been on the rise to obtain a large-area and clear display. To provide the bezel-less substrate, it is required to deposit wiring on a lateral surface of a substrate.

However, conventional technology discloses a panel in which a width of a bezel is decreased by simply forming wiring on a lateral surface of the substrate, but does not explicitly teach any apparatus and method for forming the wiring on the lateral surface of the substrate. Further, conventional technology does not disclose any specific apparatus for forming wiring that has low resistance and is excellent in electric properties on a lateral portion of the substrate.

SUMMARY OF THE INVENTION

Accordingly, an aspect of the disclosure is to provide a deposition apparatus for both lateral portions of a substrate, which can deposit wiring to both lateral portions of the substrate at once, and achieve a three-dimensional (3D) deposition improved in uniformity and quality.

According to an embodiment of the disclosure, a deposition apparatus for both lateral portions of a substrate includes: a substrate mounting drum revolvably disposed inside a chamber and allowing at least one substrate to be inserted and mounted in a direction from an outside circumferential surface toward an inside circumferential surface; at least one inside source target configured to deposit wiring onto one lateral portion of the substrate exposed protruding from an inside circumferential surface of the substrate mounting drum; and at least one outside source target configured to deposit wiring onto the other lateral portion of the substrate exposed protruding from an outside circumferential surface of the substrate mounting drum.

Here, the inside source target and the outside source target may be arranged not to face with each other.

In addition, the deposition apparatus may further include at least one cooling block disposed inside the substrate mounting drum and configured to cool the respective substrates, wherein the cooling block includes a cooling plate disposed to face the substrate, a cooling line for circulating a coolant inside the cooling plate, and a bracket formed on the cooling plate to hold and mount the substrate.

Here, the deposition apparatus may further include a substrate mounting jig configured to mount the substrate, wherein the substrate mounting jig includes a mounting plate to be in surface-contact with and mount the substrate, and the mounting plate is in surface-contact with the cooling plate with an edge portion held by and mounted to the bracket.

BRIEF DESCRIPTION OF THE DRAWINGS

The above and/or other aspects of the disclosure will become apparent and more readily appreciated from the following description of the exemplary embodiments, taken in conjunction with the accompanying drawings, in which.

DETAILED DESCRIPTION

Figure 1:
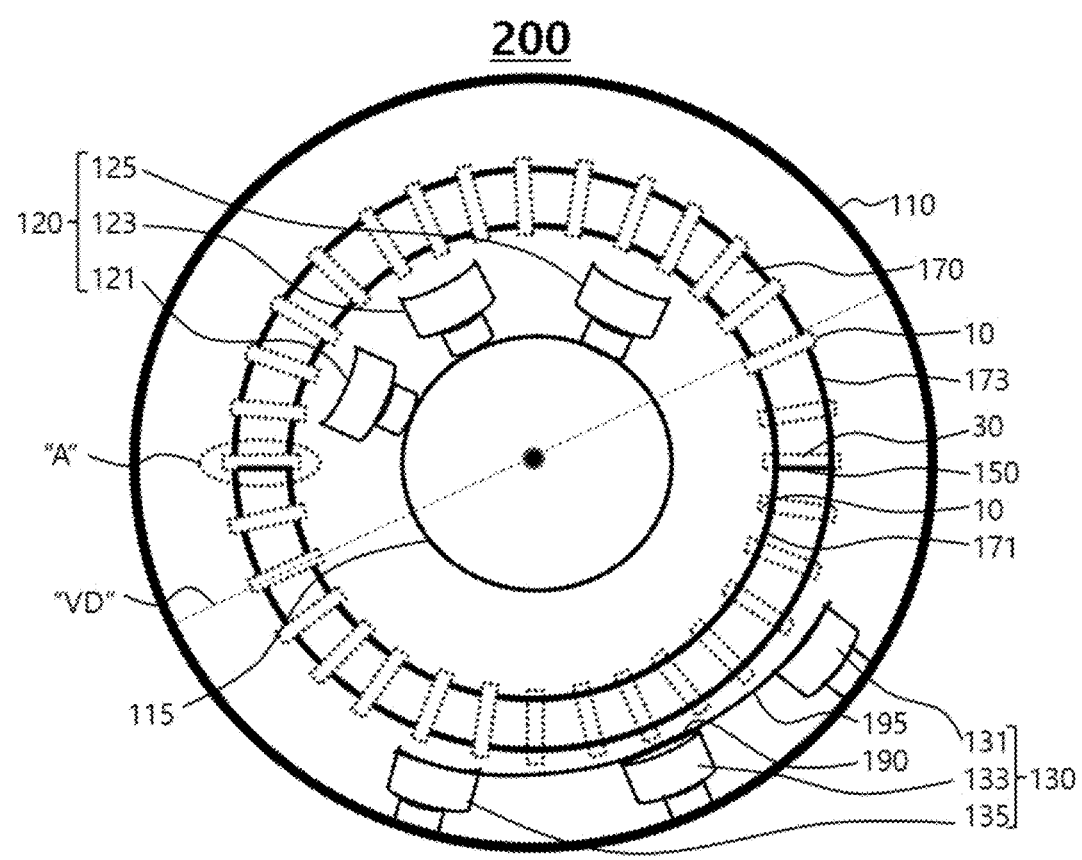
FIG. 1 is a schematic cross-sectional view of a deposition apparatus for both lateral portions of a substrate according to the disclosure.
Figure 2:
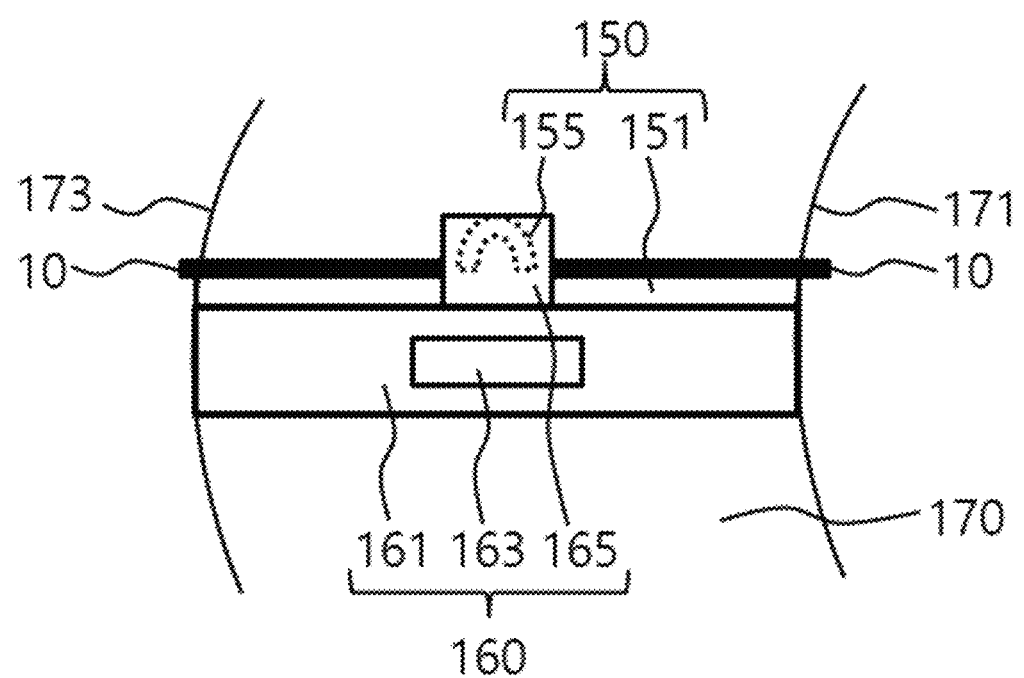
FIG. 2 is a schematic enlarged view of "A" in FIG. 1.
Figure 3:
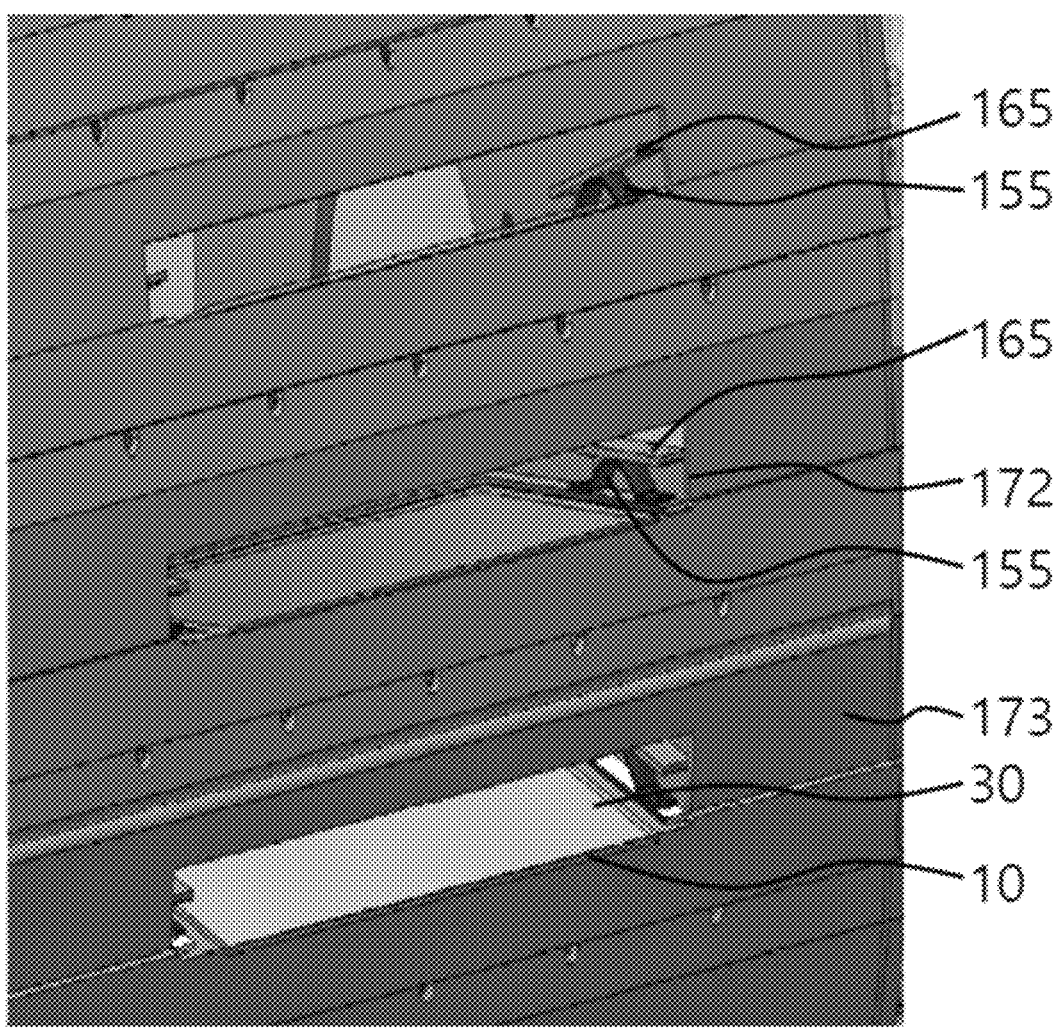
FIG. 3 is a partial enlarged view of a substrate mounting drum in a deposition apparatus for both lateral portions of a substrate according to the disclosure.
Figure 4:
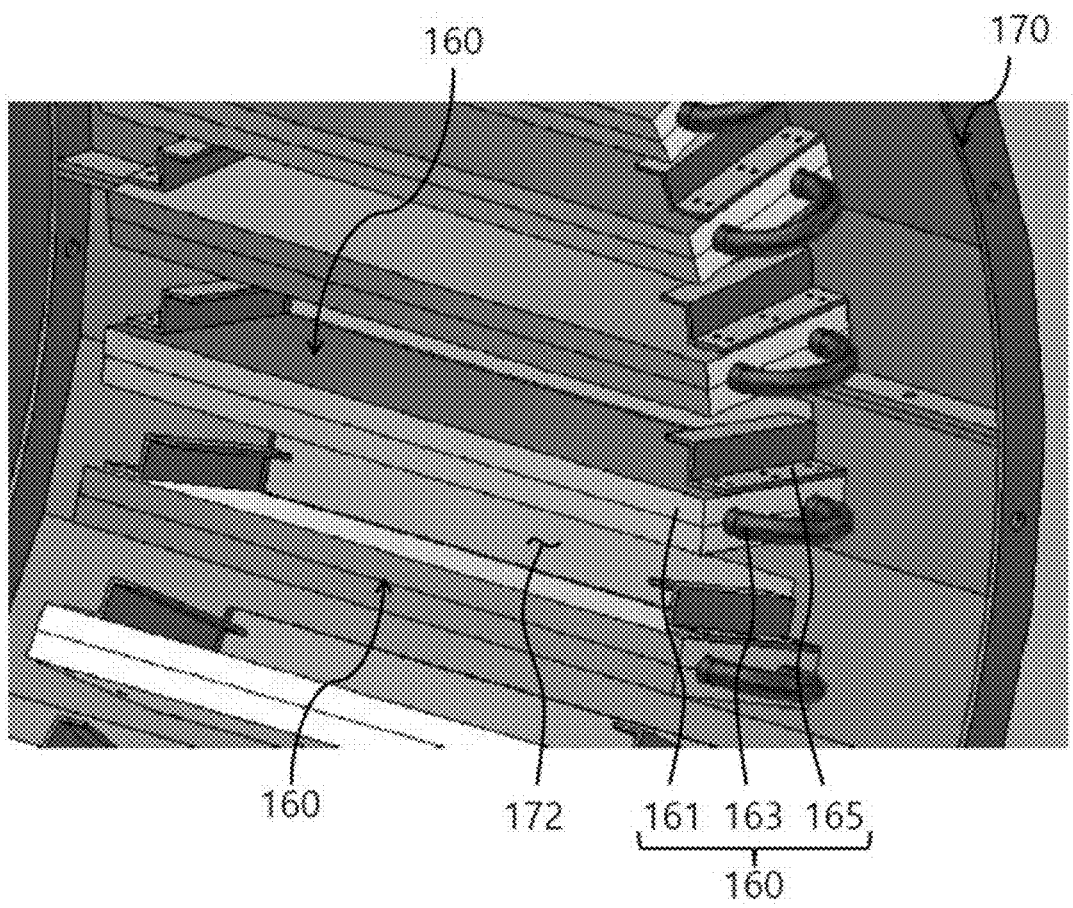
FIG. 4 is a perspective view of cooling blocks arranged inside a substrate mounting drum in a deposition apparatus for both lateral portions of a substrate according to the disclosure.
Figure 5:
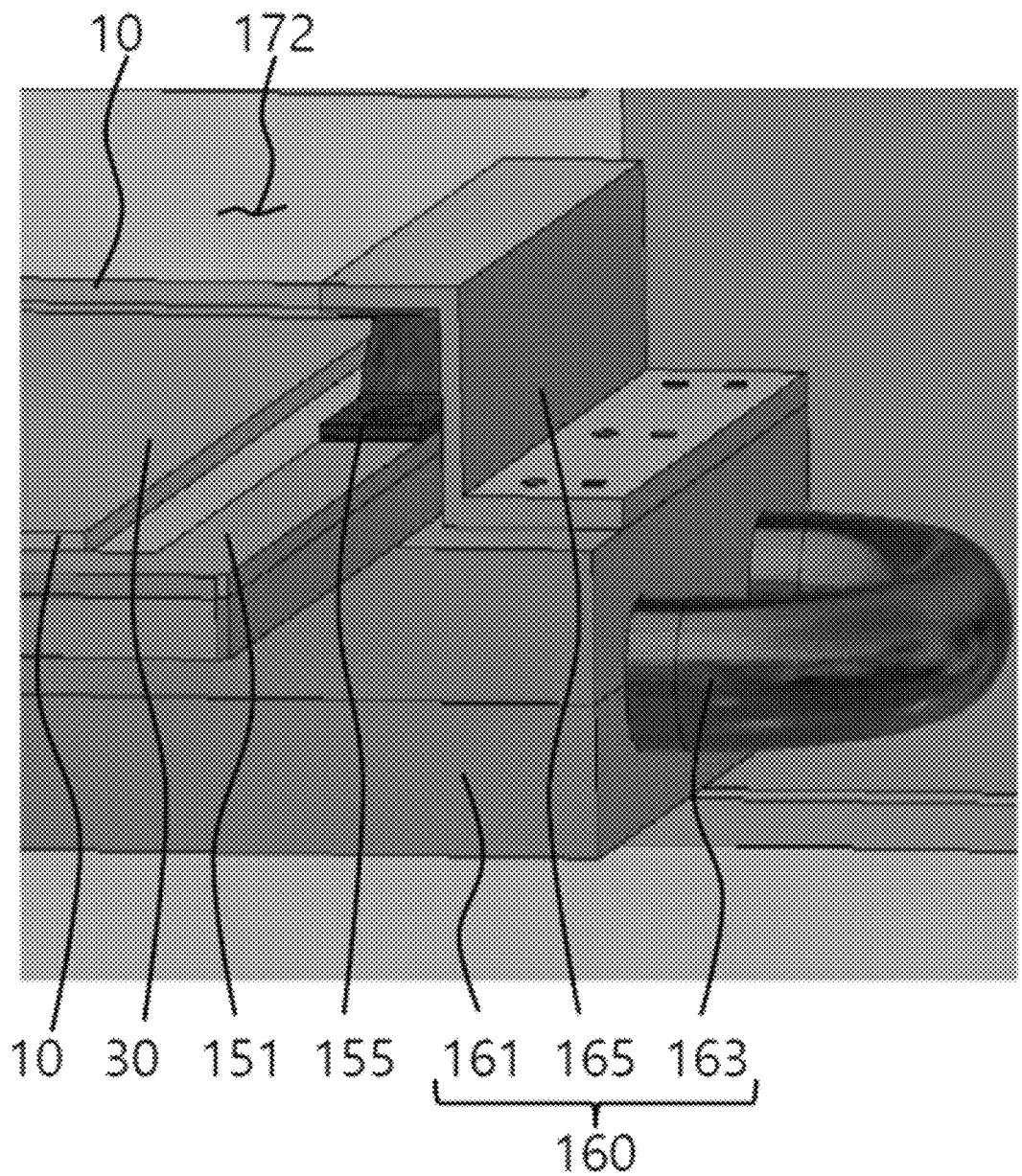
FIG. 5 is a partial enlarged view of the inside of a substrate mounting drum in a deposition apparatus for both lateral portions of a substrate according to the disclosure.

As shown in FIGS. 1 to 5, a deposition apparatus 200 for both lateral portions of a substrate according to an embodiment of the disclosure includes a substrate mounting drum 170 to which at least one substrate 30 is radially mounted, at least one inside source target 120 adjacent to an inside circumferential surface 171 of the substrate mounting drum 170 and performing wiring deposition onto one lateral portion 10 of the substrate 30, and at least one outside source target 130 adjacent to an outside circumferential surface 173 of the substrate mounting drum 170 and performing wiring deposition onto the other lateral portion 10 of the substrate 30. Further, as necessary, the apparatus 200 may further include a cooling block 160 for cooling the substrate 30, and a target shutter 190 for preventing contamination between adjacent targets.

The substrate mounting drum 170 is shaped like a hollow cylinder or polygonal prism and revolvably disposed inside a vacuum chamber 110. Further, the substrate mounting drum 170 allows at least one substrate 30 to be inserted therein and mounted thereto in a radial direction, i.e. in a direction from the outside circumferential surface 173 toward the inside circumferential surface 171. In other words, the substrate mounting drum 170 according to the disclosure is revolvably provided inside the chamber 110, so that at least one substrate 30 can be inserted in and mounted to the substrate mounting drum 170 in the direction from the outside circumferential surface 173 toward the inside circumferential surface 171.

Referring to FIG. 1, the substrate mounting drum 170 is shaped like a hollow cylinder, and a plurality of substrates 30 are radially mounted to the substrate mounting drum 170 in such a manner that the substrates 30 are mounted in the direction from the outside circumferential surface 173 of the hollow cylinder toward the inside circumferential surface 171 of the hollow cylinder. The substrate mounting drum 170 is mounted and coupled to be revolvable in the vacuum chamber 110 by various methods and structures. Consequently, the substrate mounting drum 170 mounted with at least one substrate in the radial direction is disposed to be revolvable inside the vacuum chamber 110

Like this, the substrate mounting drum 170 has a hollow cylindrical shape and thus includes the inside circumferential surface 171 and the outside circumferential surface 173. Further, the substrate mounting drum 170 is revolvable, so that the plurality of substrates 30 can be mounted in the radial direction.

Because the at least one substrate 30 is radially inserted in and mounted to the substrate mounting drum 170, both lateral portions 10 of the at least one substrate 30 can be respectively disposed to protrude from the inside circumferential surface 171 and the outside circumferential surface 173 of the substrate mounting drum 170. According to the disclosure, the deposition apparatus 200 for both lateral portions of a substrate refers to a deposition apparatus capable of performing wiring deposition onto both lateral portions 10 of the substrate 30 at once, and therefore the substrate 30 is disposed so that one lateral portion 10 can be exposed protruding from the inside circumferential surface 171 of the substrate mounting drum 170, and the other lateral portion 10 can be exposed protruding from the outside circumferential surface 173 of the substrate mounting drum 170.

As described above, one lateral portion 10 of the at least one substrate 30 exposed protruding from the inside circumferential surface 171 of the substrate mounting drum 170 is subjected to sputtering based on at least one inside source target 120. Therefore, the at least one inside source target 120 is disposed to deposit a predetermined wiring pattern onto the one lateral portion 10 of the substrate 30. That is, the at least one inside source target 120 performs sputtering-based wiring deposition onto the one lateral portion 10 of the substrate 30 exposed protruding from the inside circumferential surface 171 of the substrate mounting drum 170.

Further, as described above, the other lateral portion 10 of the at least one substrate 30 exposed protruding from the outside circumferential surface 173 of the substrate mounting drum 170 is subjected to sputtering based on at least one outside source target 130. Therefore, the at least one outside source target 130 is disposed to deposit a predetermined wiring pattern onto the other lateral portion 10 of the substrate 30. That is, the at least one outside source target 130 performs sputtering-based wiring deposition onto the other lateral portion 10 of the substrate 30 exposed protruding from the outside circumferential surface 173 of the substrate mounting drum 170.

The inside source target 120 and the outside source target 130 are provided as targets of metal to be deposited on both lateral portions 10 of the substrate 30, and such metal targets serve as cathodes in a sputtering process. The inside source target 120 and the outside source target 130 corresponding to the metal targets functioning as the cathodes are used to deposit wiring of a predetermined metal layer onto both lateral portions 10 of the substrate 30.

However, the substrate mounting drum 170 operates to revolve while the sputtering is carried out using the inside source target 120 and the outside source target 130, and therefore three-dimensional (3D) deposition is eventually carried out by the inside source target 120 and the outside source target 130 with respect to both lateral portions 10 of the substrate 30 (specifically, with respect to a lateral surfaces of the substrate 30 and upper and lower surfaces of the substrate 30 adjacent to the lateral surfaces).

Therefore, for the purpose of the 3D deposition with respect to both lateral portions 10 of the substrate 30, the deposition apparatus 200 for both lateral portions of a substrate according to the disclosure does not need to include the respective source targets for performing sputtering deposition with respect to the lateral portions of the substrate 30, i.e. onto the lateral surfaces of the substrate 30 and the upper and lower surfaces of the substrate 30 adjacent to the lateral surfaces. In other words, one source target is enough to perform the 3D deposition with respect to each corresponding lateral portion 10 of the substrate 30. In result, the deposition apparatus 200 for both lateral portions of a substrate according to the disclosure is advantageous to minimize time, effort and costs which will be incurred for a system employed and applied for the 3D deposition with respect to both lateral portions 10 of the substrate 30.

As described above, the deposition apparatus 200 for both lateral portions of a substrate according to the disclosure refers to an apparatus for forming the wiring by performing the deposition not onto the upper and lower surfaces of the substrate 30 but with respect to both lateral portions 10 of the substrate 30.

The lateral portion 10 of the substrate 30 according to the disclosure includes a lateral surface (see '11' in FIGS. 7 and 8) of the substrate 30, and an upper surface (see '13' in FIGS. 7 and 8) and a lower surface (see '15' in FIGS. 7 and 8) of the substrate 30 adjacent to the lateral surface 11. The wiring on the lateral portion 10 of the substrate 30 is formed to electrically connect an upper circuit pattern (see '60' in FIGS. 7 and 8) formed on the upper surface of the substrate 30 and a lower circuit pattern (see '80' in FIGS. 7 and 8) formed on the lower surface of the substrate 30.

Detailed technical features of the substrate 30 according to the disclosure and the lateral portions 10 of the substrate 30 are as follows.

To use the deposition apparatus 200 for both lateral portions of a substrate according to an embodiment of the disclosure in depositing wiring on both lateral portions 10 of the substrate 30, masking is first performed with respect to both lateral portions 10 of the substrate 30 on which the wiring will be formed. Specifically, wiring deposition onto the both lateral portions of the substrate 30 according to the disclosure is based on a sputtering method, and therefore a deposition mask is attached to the substrate 30, thereby performing the masking with respect to both lateral portions 10 of the substrate 30.

The masking for both lateral portions 10 of the substrate 30 refers to a process of attaching the deposition mask to the substrate 30 so that the wiring can be deposited on the lateral portion 10 of the substrate by the sputtering method. The deposition mask is provided in a shape of "[", and thus attached to not only the lateral surface 11 of the substrate 30 but also the upper and lower surfaces 13 and 15 of the substrate 30.

When the process of performing the masking by attaching the deposition mask to the substrate 30 including both lateral portions 10 onto which the wiring will be formed is completed, a sputtering process is performed with respect to the substrate 30 subjected to the masking. In other words, the substrate 30 subjected to the masking is inserted into the vacuum chamber 110 and mounted to the substrate mounting drum 170 with only both exposed lateral portions of the substrate 30, and then the wiring is deposited on both lateral portions 10 of the substrate 30 by the sputtering method.

The wiring onto both lateral portions of the substrate 30 according to the disclosure is deposited inside the vacuum chamber 110 by the sputtering method and formed at once. Therefore, when the deposition mask having the "["-shape is attached to each of both lateral portions of the substrate 30 onto which the wiring will be formed, the substrate 30 is inserted in the chamber 110, in which sputtering is performed, and then subjected to the sputtering while being mounted to the substrate mounting drum 170.

The sputtering process is performed focusing the deposition on both lateral portions of the substrate 30 onto which the wiring will be formed. That is, the sputtering process according to the disclosure is carried out for the deposition onto the whole of the substrate 30 but each of both lateral portions of the substrate 30.

In particular, the substrate 30 according to the disclosure may refer to a substrate of which upper and lower surfaces are mounted with various elements and formed with respective circuit patterns. Further, as shown in FIG. 7, each of both lateral portions of the substrate 30 onto which the wiring will be formed includes the lateral surface 11 of the substrate 30 forming an edge of the substrate 30, the upper surface of the substrate 30 adjacent to the lateral surface 11 of the substrate 30, i.e. the lateral-surface-contiguous upper surface 13, and the lower surface of the substrate 30 adjacent to the lateral surface 11 of the substrate 30, i.e. the lateral-surface-contiguous lower surface 15.

Figure 7:
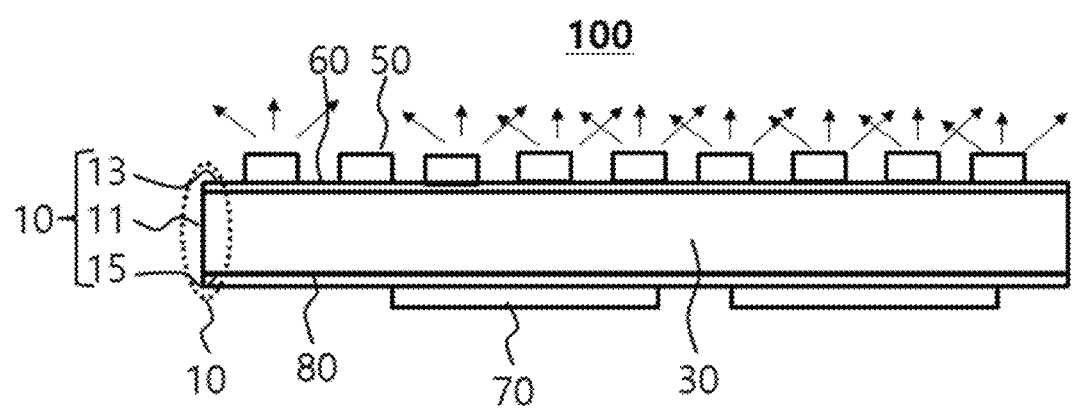
FIG. 7 is a cross-sectional view of an exemplary substrate in which wiring will be formed on a lateral portion by a deposition apparatus for both lateral portions of a substrate according to an embodiment of the disclosure.

Specifically, as shown in FIG. 7, each of both the lateral portions of the substrate 30 according to the disclosure includes the lateral surface 11 of the substrate 30, the upper surface of the substrate 30 adjacent to the lateral surface 11 of the substrate 30 (i.e. the lateral-surface-contiguous upper surface 13), and the lower surface of the substrate 30 adjacent to the lateral surface 11 of the substrate 30 (i.e. the lateral-surface-contiguous lower surface 15). Further, the wiring on the lateral portion 10 of the substrate 30, i.e. the lateral-surface wiring (see '90' in FIG. 8) is formed to electrically connect the upper circuit pattern 60 formed on the upper surface of the substrate 30 and the lower circuit pattern 80 formed on the lower surface of the substrate 30.

In more detail, the substrate 30 according to the disclosure may refer to a substrate applied to various elements, devices and apparatuses. For example, the substrate 30 according to the disclosure may be applied to a display apparatus 100 as shown in FIG. 7. Therefore, display elements 50 such as liquid crystal display (LCD) elements, organic light emitting diodes (OLED), micro light emitting diodes (LED), etc. may be arrayed on the substrate 30 to thereby form a display element matrix. Further, a control element 70 and various related elements for controlling the display elements 50 and transmitting/receiving an electric signal may be formed beneath the substrate 30.

Figure 8:
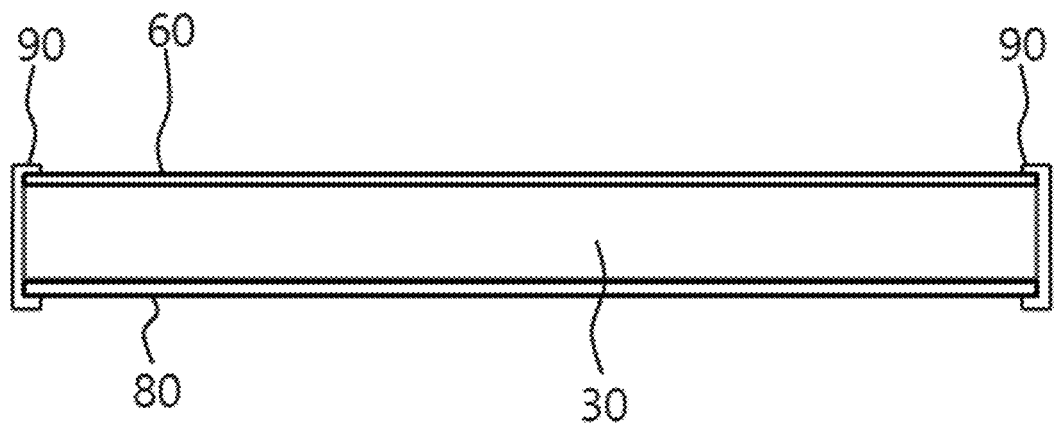
FIG. 8 is a cross-sectional view of a substrate formed with wiring on a lateral portion by a deposition apparatus for both lateral portions of a substrate according to an embodiment of the disclosure.

Wiring for the display elements 50, i.e. the upper circuit pattern 60 is formed on the substrate 30, and wiring for the control elements 70 or the like, i.e. the lower circuit pattern 80 is formed beneath the substrate 30. Therefore, each of both lateral portions of the substrate 30 are respectively formed with lateral-surface wiring 90 for electrically connecting the upper circuit pattern 60 and the lower circuit pattern 80 as shown in FIG. 8.

As described above, the substrate 30 subjected to the masking is inserted into the vacuum chamber 110 undergoes the sputtering. However, the sputtering in the vacuum chamber 110 refers to a process for forming the lateral-surface wiring 90 on each of both lateral portions of the substrate 30. Therefore, the sputtering in the vacuum chamber 110 is performed focusing the deposition on each of both lateral portions of the substrate 30.

To this end, the wiring (i.e. the lateral-surface wiring 90) to be formed on each of both lateral portions of the substrate 30 according to the disclosure is deposited by the sputtering using the inside source target 120 and the outside source target 130 while the substrate mounting drum 170 revolves inside the chamber 110. That is, while the sputtering is performed using the inside source target 120 and the outside source target 130, the substrate mounting drum 170 mounted with the substrate revolves with only both lateral portions 10 of the substrate 30 exposed toward the inside source target 120 and the outside source target 130, and thus the 3D deposition is possible with respect to both lateral portions of the substrate 30, thereby forming the 3D deposition wiring with respect to the lateral portion 10 of the substrate 30, i.e. the lateral surface 11, the lateral-surface-contiguous upper surface 13 and the lateral-surface-contiguous lower surface 15 of the substrate 30.

There may be a plurality of inside source targets 120 for performing the wiring deposition to one lateral portion 10 of the substrate 30, which is exposed through the inside circumferential surface 171 of the substrate mounting drum 170, between both lateral portions 10 of the substrate 30, and a plurality of outside source targets 130 for performing the wiring deposition to the other lateral portion 10 of the substrate 30, which is exposed through the outside circumferential surface 173 of the substrate mounting drum 170. The plurality of inside source targets 120 and the plurality of outside source targets 130 will be described later.

However, the inside source target 120 and the outside source target 130 need to be arranged not to face each other. The inside source target 120 and the outside source target 130 respectively perform the sputtering-based deposition to one lateral portion 10 and the other lateral portion 10 of the substrate 30 at the same time. Therefore, if the inside source target 120 and the outside source target 130 are arranged to face each other, the sputtering is affected by the opposite source target, thereby causing problems of lowering a deposition efficiency and further contaminating the opposite source target.

Therefore, the inside source target 120 and the outside source target 130 according to the disclosure are arranged not to face each other. In more detail, it is desirable that not only the inside source target 120 and the outside source target 130 are spaced apart from each other and arranged not to face each other, but also the source targets at one side are arranged to keep their backs to the source targets at the other side as shown in FIG. 1. Referring to FIG. 1, the inside source targets 120 are disposed with their backs to the outside source targets 130.

Specifically, one of the inside source target 120 and the outside source target 130 according to the disclosure is placed at one side of a virtual divider (VD), and the other one is placed at the other side of the VD. Here, the VD refers to a plane by which the substrate mounting drum 170 shaped like a hollow cylinder is virtually cut in half in a lengthwise direction.

Like this, the inside source target 120 and the outside source target 130 are placed at opposite sides across the VD, and therefore the sputtering is free from the opposite source target and does not contaminate the opposite source target.

According to the disclosure, the deposition apparatus 200 for both lateral portions of a substrate includes at least one cooling block 160 placed inside the substrate mounting drum 170 and cooling each substrate 30, as shown in FIGS. 2 to 5.

The cooling block 160 has a structure for holding the corresponding substrate 30 and enhancing an efficiency of cooling the substrate 30. To this end, the cooling block 160 includes a cooling plate 161 disposed to face the substrate 30, a cooling line 163 for circulating a coolant inside the cooling plate 161, and a bracket 165 formed on the cooling plate 161 and holding the substrate 30 to be mounted.

Because the cooling plate 161 is disposed to face the corresponding substrate 30, the cooling plate 161 is mounted in a direction from the inside of the substrate mounting drum 170 shaped like a hollow cylinder toward the center, i.e. in a radial direction. The cooling plate 161 is shaped like a plate, and is internally formed with a space through which the cooling line 163 passes.

The cooling line 163 serves to circulate the coolant into the cooling plate 161. The cooling line 163 may be provided in the form of a cooling pipe, and the coolant moves through the inside of the cooling line 163. The cooling plate 161 internally provided with the cooling line 163 may be in direct surface-contact with the substrate 30 or may be in surface-contact with a mounting plate 151 being in surface-contact with the substrate 30, thereby cooling the substrate 30.

On the cooling plate 161, the bracket 165 is formed to directly hold the substrate 30 or hold the mounting plate 151 holding the substrate 30. That is, the bracket 165 is formed on the cooling plate 161 to hold the substrate 30.

The brackets 165 are provided at both sides on a mounting surface of the cooling plate 161 to be in surface-contact with the substrate 30 or the mounting plate 151. The bracket 165 supports and holds an edge portion of the substrate 30 or the mounting plate 151 mounted to be in surface-contact with the cooling plate 161. Therefore, the substrate 30 or the mounting plate 151 slides being in surface-contact with the cooling plate 161 so that the bracket 165 can hold the edge portion of the substrate 30 or the mounting plate 151. Consequently, it is desirable that the bracket 165 is a Z-bracket.

According to the disclosure, the deposition apparatus 200 for both lateral portions of a substrate further includes the substrate mounting jig 150 for mounting the substrate 30. The substrate mounting jig 150 includes the mounting plate 151 with and to which the substrate 30 is in surface-contact and mounted, and an edge portion of the mounting plate 151 is stationarily mounted to the bracket 165 while being in surface-contact with the cooling plate 161.

The substrate mounting jig 150 includes the mounting plate 151 with which the substrate 30 to be mounted is in surface-contact. The mounting plate 151 is firmly and stably coupled while being mounted to be in surface-contact with the cooling plate 161.

While the mounting plate 151 is being in surface-contact with the cooling plate 161, the bracket 165 supports and holds the edge portion of the mounting plate 151. In this case, the edge portion of the mounting plate 151 needs to be not only firmly and stably supported by the bracket 165 but also easily removed from the bracket 165.

To this end, the deposition apparatus 200 for both lateral portions of a substrate according to the disclosure a contact spring 155 mounted to be interposed between the edge portion of the mounting plate 151 and the bracket 165 so that the mounting plate 151 can be elastically supported by the bracket 165.

The contact spring 155 is mounted to the edge portion of the mounting plate 151 or a lower portion of the bracket 165, so that the edge portion of the mounting plate 151 can be elastically supported by the bracket 165 when the mounting plate 151 is mounted to the cooling plate 161. Therefore, the edge portion of the mounting plate 151 is firmly and stably mounted by the bracket 165 with the contact spring 155.

As described above, the contact spring 155 may be coupled to the bracket 165 or the edge portion of the mounting plate 151. However, for easy maintenance and replacement of the contact spring 155, the contact spring 155 is mounted to the mounting plate 151 so that the contact spring 155 can be easily taken out of the substrate mounting drum 170.

FIGS. 2 to 5 illustrate that the contact spring 155 is coupled to the edge portion of the mounting plate 151. The contact springs 155 are coupled to both edge portions of the mounting plate 151 at positions corresponding to the brackets 165. Each of the contact springs 155 has opposite portions coupled to the edge portion of the mounting plate 151, and a middle portion raised upward. Therefore, the contact spring 155 may become in close-contact with the lower portion of the bracket 165 when the mounting plate 151 is mounted to the cooling plate 161, thereby causing the mounting plate 151 to be elastically supported by the bracket 165.

Below, more detailed technical features and additional technical features of the deposition apparatus 200 for both lateral portions of a substrate according to the disclosure will be described in detail.

The deposition apparatus 200 for both lateral portions of a substrate according to an embodiment of the disclosure may include the plurality of inside source targets 120 and the plurality of outside source targets 130 as shown in FIG. 1. FIG. 1 illustrates that the inside source targets 120 include three inside source targets, i.e. a first inside target 121, a second inside target 123, and a third inside target 125, and the outside source targets 130 include three outside source targets, i.e. a first outside target 131, a second outside target 133 and a third outside target 135.

As described above, when each of the inside source target 120 and the outside source target 130 include a plurality of source targets, the plurality of source targets may be achieved by cathode targets made of one metal, i.e. the same metal targets, or may be achieved by cathode targets made of various kinds of metals, i.e. different metal targets, as necessary. Like this, each of the inside source target 120 and the outside source target 130 according to the disclosure includes a plurality of source targets, and the plurality of source targets are achieved by the same metal targets or the different metal targets.

The former case (i.e. where the source target includes a plurality of source targets and the plurality of source targets are achieved by the same metal targets) is to form the wiring of only one metal layer on both lateral portions of the respective substrates 30. That is, the plurality of source targets includes the same metal targets made of one metal.

Like this, when the plurality of source targets achieved by the same metal targets is used, the plurality of substrates 30 is continuously subjected to the sputtering to thereby deposit the wiring thereon while the substrate mounting drum 170 is revolving. In result, the wiring deposition is more rapidly carried out with respect to each of both lateral portions of the plurality of substrates 30, and it is thus possible to improve production and deposition efficiencies.

As described above, when each of the inside source target 120 and the outside source target 130 includes a plurality of source targets and the plurality of source targets is achieved by the same metal targets, the plurality of substrates are mounted at regular intervals (i.e. with the same included angle between the adjacent substrates) and the plurality of source targets are also arranged at regular intervals as being spaced out at the same distance as the distance between the respective lateral portions 10 of the adjacent substrates.

As above, when the plurality of substrates are mounted having the same included angles therebetween, and the plurality of source targets are also arranged being spaced out at the same distance as the distance between the respective lateral portions 10 of the adjacent substrates, the deposition is equally and uniformly formed among the lateral portions 10 of the respective substrates 30 and the wiring deposition on the lateral portion 10 of the substrate 30 while the substrate mounting drum 170 is revolving.

On the other hand, the latter case (i.e. where the source target includes a plurality of source targets and the plurality of source targets are achieved by the different metal targets) is to form the wiring of a plurality of metal layers on both lateral portions 10 of the respective substrates 30. That is, the plurality of source targets includes different metal targets made of different kinds of metal.

The plurality of inside source targets 120 and the plurality of outside source target 130 are operated in sequence to sequentially stack the corresponding metal layers on both the corresponding lateral portions of the respective substrates 30 through sputtering, thereby ultimately forming the wiring of the plurality of metal layers on both lateral portions of the respective substrates 30.

Meanwhile, it is preferable to have no effect on the sputtering of the opponent source target but prevent the opponent source target from contamination during the sputtering-based deposition using the plurality of inside source targets 120 and the plurality of outside source targets 130

To this end, the first inside target 121 of the inside source target 120 and the first outside target 131 of the outside source target 130 are achieved by the same metal targets; the second inside target 123 of the inside source target 120 and the second outside target 133 of the outside source target 130 are achieved by the same metal targets; and the third inside target 125 of the inside source target 120 and the third outside target 135 of the outside source target 130 are achieved by the same metal targets. Further, the first inside target 121 and the first outside target 131 are configured to simultaneously perform the sputtering; the second inside target 123 and the second outside target 133 are configured to simultaneously perform the sputtering; and the third inside target 125 and the third outside target 135 are configured to simultaneously perform the sputtering. By such metal target configuration and operation control, the inside source target 120 and the outside source target 13 do not interfere with each other's sputtering and prevent contamination.

Meanwhile, when each of the inside source target 120 and the outside source target 130 includes a plurality of source targets and the plurality of source targets are respectively achieved by the different metal targets, only one source target for a specific metal target operates among the plurality of source targets for each of the inside source target 120 and the outside source target 130, thereby controlling metal corresponding to the specific metal target to be sputtered onto the lateral surface of the substrate.

During such operation, another source target (e.g. the second outside target 133) adjacent to the one source target (e.g. the first outside target 131) needs to be prevented from being contaminated with the sputtering of the metal target corresponding to the one source target. In other words, metal of the metal target corresponding to the one source target needs to be prevented from being deposited onto another metal target of another adjacent source target.

Figure 6:
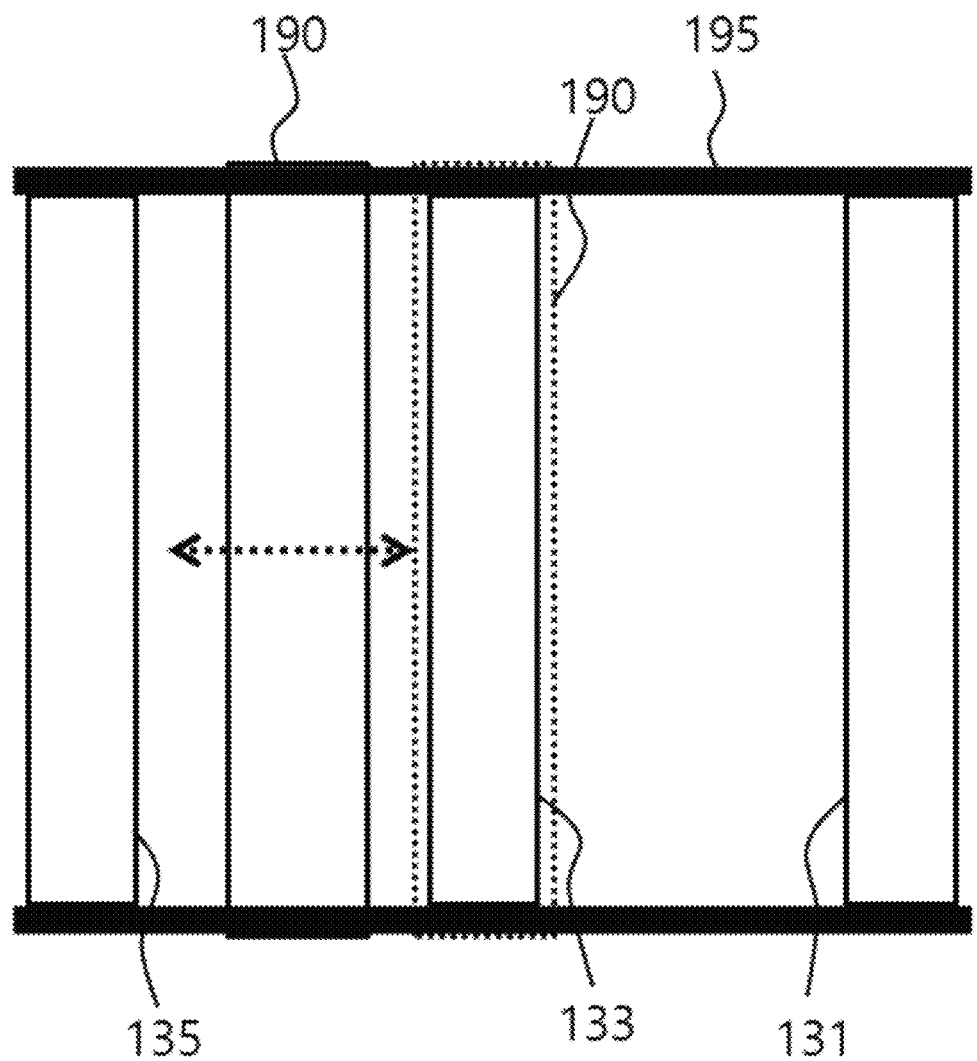
FIG. 6 is a schematic plan view showing a layout relationship among an outside source target, a target shutter, and a moving rail in a deposition apparatus for both lateral portions of a substrate according to the disclosure.

To this end, as shown in FIGS. 1 and 6, the deposition apparatus 200 for both lateral portions of a substrate according to the disclosure may further include the target shutter 190 for covering the surface of another adjacent source target to prevent metal of the source target that is operating to perform sputtering from being deposited onto another adjacent source target. That is, when the plurality of source targets for each of the inside source target 120 and the outside source target 130 according to the disclosure are achieved by different metal targets, the target shutter 190 is additionally provided to cover the surface of another source target adjacent to the source target that is operating to perform the sputtering.

The target shutter 190 is formed and disposed adjacent to both the inside source target 120 and the outside source target 130. FIGS. 1 and 6 illustrate that the target shutter 190 is formed adjacent to the outside source target 130 by way of example. Below, the structure and operation of the target shutter 190 disposed adjacent to the outside source target 130 will be described, but this description is equally applied to even the structure and operation of the target shutter adjacent to the inside source target 120.

As shown in FIGS. 1 and 6, the target shutter 190 is provided to be movable along a moving rail 195. To prevent interference with the sputtering of the plurality of target sources 131, 133 and 135, the moving rail 195 forms a pair disposed along opposite sides of each target source. Further, the target shutter 190 is put on and engages with one pair of moving rails 195 disposed along the opposite sides of each target source.

Therefore, the target shutter 190 is movable along the pair of moving rails 195, and moved to cover the surface of another source target adjacent to a certain source target that is operating to perform the sputtering. Consequently, it is possible to prevent metal of a metal target corresponding to a certain source target from being deposited to and contaminating other adjacent source targets during the sputtering of the certain source target.

FIG. 6 illustrates one target shutter 190 movable on one pair of moving rails 195. However, as necessary, two target shutters 190 may be disposed and movable on one pair of moving rails 195. In this case, when the middle source target 133 among three source targets 131, 133, 135 as shown in FIG. 6 is controlled to perform the sputtering, the two target shutters 190 may be controlled to respectively move to the other two adjacent source targets 131 and 135 and cover the surfaces of the source targets 131 and 135.

According to the disclosure, a deposition apparatus for both lateral portions of a substrate can deposit wiring to both lateral portions of the substrate at once, and have effect on achieving a three-dimensional (3D) deposition improved in uniformity and quality.

Although a few embodiments of the disclosure have been described above, these are for illustrative purpose only and it will be appreciated by a person having an ordinary skill in the art that various changes and their equivalents may be made in these embodiments. Therefore, the scope of the disclosure is defined in the appended claims.

What is claimed is:

1. A deposition apparatus for both lateral portions of a substrate, comprising:
a substrate mounting drum revolvably disposed inside a chamber and allowing at least one substrate to be inserted and mounted in a direction from an outside circumferential surface toward an inside circumferential surface;
at least one inside source target configured to deposit wiring onto one lateral portion of the substrate exposed protruding from an inside circumferential surface of the substrate mounting drum;
at least one outside source target configured to deposit wiring onto the other lateral portion of the substrate exposed protruding from an outside circumferential surface of the substrate mounting drum; and
at least one cooling block disposed inside the substrate mounting drum and configured to cool the respective substrates,
wherein the cooling block comprises a cooling plate disposed to face the substrate, a cooling line for circulating a coolant inside the cooling plate, and a bracket formed on the cooling plate to hold and mount the substrate.

2. The deposition apparatus according to claim 1, wherein the at least one inside source target and the at least one outside source target are arranged not to face with each other.

3. The deposition apparatus according to claim 1, further comprising a substrate mounting jig configured to mount the substrate,
wherein the substrate mounting jig comprises a mounting plate to be in surface-contact with and mount the substrate, and the mounting plate is in surface-contact with the cooling plate with an edge portion held by and mounted to the bracket.

* * * * *